(12) United States Patent
Trimberger (10) Patent No.: US 8,576,641 B1
(45) Date of Patent: Nov. 5, 2013

(54) METHOD OF AND CIRCUIT FOR PROVIDING NON-VOLATILE MEMORY IN AN INTEGRATED CIRCUIT

(75) Inventor: Stephen M. Trimberger, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 374 days.

(21) Appl. No.: 12/714,216

(22) Filed: Feb. 26, 2010

(51) Int. Cl.
*G11C 7/00* (2006.01)

(52) U.S. Cl.
USPC .................................................. 365/189.15

(58) Field of Classification Search
USPC .......................................................... 711/103
See application file for complete search history.

(56) References Cited

U.S. PATENT DOCUMENTS

| | | | |
|---|---|---|---|
| 4,422,163 A | 12/1983 | Oldenkamp | |
| 5,023,874 A | 6/1991 | Houston | |
| 5,422,852 A | 6/1995 | Houston et al. | |
| 6,101,421 A | 8/2000 | Goedken et al. | |
| 7,111,224 B1 | 9/2006 | Trimberger | |
| 7,353,374 B1 | 4/2008 | Trimberger | |
| 7,436,726 B1 | 10/2008 | Lovejoy | |
| 2004/0213027 A1* | 10/2004 | Liu et al. | 365/49 |
| 2007/0103967 A1* | 5/2007 | Boeve | 365/158 |
| 2007/0198784 A1* | 8/2007 | Miyata et al. | 711/154 |
| 2008/0250269 A1* | 10/2008 | Cherian et al. | 714/6 |
| 2008/0270703 A1* | 10/2008 | Henrion et al. | 711/128 |
| 2010/0095053 A1* | 4/2010 | Bruce et al. | 711/103 |
| 2010/0199021 A1* | 8/2010 | Harper et al. | 711/103 |
| 2011/0173380 A1* | 7/2011 | Yano et al. | 711/103 |

OTHER PUBLICATIONS

Lesea, Austin, "IP Security in FPGAs," *WP261* (v. 1.0), Feb. 16, 2007, pp. 1-9, available from Xilinx, Inc., 2100 Logic Drive, San Jose, California 95124, USA.
Skorobogatov, Serge!, "Low temperature data remanence in static RAM," *Univ. of Cambridge Technical Report No. 536*, Jun. 2002, pp. 1-9, available from University of Cambridge, 15 JJ Thomson Avenue, Cambridge CB3 OFD, United Kingdom.
Tuan, Tim, "Analysis of Data Remanence in a 90 nm FPGA," *Proc. of the 2007 Custom Integrated Circuits Conference*, Sep. 16-19, 2007, pp. 93-96, San Jose, California, USA.
U.S. Appl. No. 12/402,362, filed Mar. 11, 2009, Trimberger, Stephen, M., Xilinx, Inc., 2100 Logic Drive, San Jose, California 95124, USA.

* cited by examiner

*Primary Examiner* — Hoai V Ho
*Assistant Examiner* — Min Huang
(74) *Attorney, Agent, or Firm* — John J. King (57) ABSTRACT

A method of providing non-volatile memory in an integrated circuit is disclosed. The method may comprise storing a plurality of data blocks in volatile memory elements of the integrated circuit, wherein each data block of the plurality of data blocks comprises a plurality of data bits; reading back the plurality of data bits associated with a data block of the plurality of data blocks; determining, by a control circuit, whether values read back for the plurality of data bits associated with the data block indicate valid data in the data block; and reading back, for another data block of the plurality of data blocks, stored data bits to determine a value for the other data block. A circuit for providing non-volatile memory in an integrated circuit is also disclosed.

19 Claims, 10 Drawing Sheets

METHOD OF AND CIRCUIT FOR PROVIDING NON-VOLATILE MEMORY IN AN INTEGRATED CIRCUIT

FIELD OF THE INVENTION

An embodiment of the present invention relates generally to integrated circuits, and in particular, to methods of and circuits for providing non-volatile memory in an integrated circuit.

BACKGROUND

Memory elements associated with integrated circuit devices may comprise either volatile or non-volatile memory elements. Volatile memory elements will not retain data stored in the memory elements when power is removed from the memory elements. However, there may be some circumstances where it may be necessary to retain data after power is removed. Accordingly, non-volatile memory elements, which retain stored data, may be implemented in an integrated circuit device. Implementing non-volatile memory may have a number of disadvantages, including higher cost and reduced performance of the entire integrated circuit device due to the additional manufacturing steps required for non-volatile memory compared to volatile memory elements.

Data may be retained in volatile memory by implementing a source of back-up power, such as a back-up battery, which is applied to the volatile memory after the main power is removed. The source of back-up power is provided to maintain power in the volatile memory. However, such a source of back-up power may not only be expensive to implement, but may also unnecessarily occupy space in a device or system implementing the volatile memory. Further, in applications of non-volatile memory related to the security of data, an external power supply or external memory may be considered too insecure for the application. While it may be beneficial to retain data in the memory, it may be cost or resource prohibitive to implement non-volatile memory or to provide a back-up source of power in some applications.

Further, it may be necessary to retain data for only a short period of time in certain instances. Accordingly, implementing non-volatile memory may not be essential to the active operation of the device, and the non-volatile memory may only be used in limited applications or during limited times. However, such non-volatile memory may provide an important, although limited, function necessary in the overall operation of the device.

SUMMARY

A method of providing non-volatile memory in an integrated circuit is disclosed. The method may comprise storing data blocks in volatile memory elements of the integrated circuit, wherein each data block of the plurality of data blocks comprises a plurality of data bits; reading back the plurality of data bits associated with a data block of the plurality of data blocks; determining, by a control circuit, whether values read back for the plurality of data bits associated with the data block indicate valid data in the data block; and reading back, for another data block of the plurality of data blocks, stored data bits to determine a value for the other data block.

According to an alternate embodiment, a method of providing non-volatile memory in an integrated circuit may comprise storing data in volatile memory elements for each bit of a first data block; determining whether a condition that would cause the volatile memory elements to lose their states has been encountered; reading back the bits of the first data block; and determining, by a control circuit, based upon the bits of the first data block which have been read back, whether valid data is stored in the first data block.

A circuit for providing non-volatile memory in an integrated circuit is also disclosed. The circuit may comprise at least one memory block for storing a data bit, the at least one memory block comprising a plurality of volatile memory elements storing a common logical value, and a control circuit coupled to the at least one memory block, wherein the control circuit determines whether data stored in the at least one memory block is valid and reads back, for the at least one memory block, stored data bits to determine a value for a data word if the data stored in the at least one block is determined to be valid.

DETAILED DESCRIPTION

Figure 1:
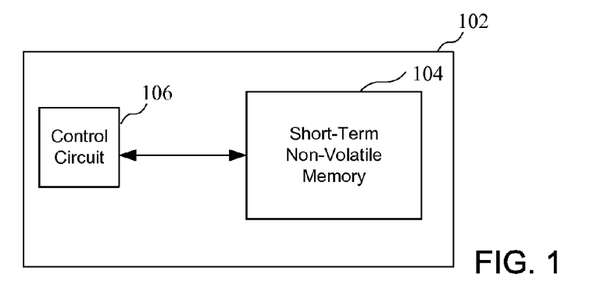
FIG. 1 is a block diagram of a circuit enabling a non-volatile memory in an integrated circuit according to an embodiment of the present invention.

Turning first to FIG. 1, a block diagram of a circuit enabling a non-volatile memory in an integrated circuit according to an embodiment of the present invention is shown. A circuit 102 comprises a short-term volatile memory 104 coupled to a control circuit 106. The circuit 102 may be an integrated circuit, for example, or a circuit board having a plurality of elements implementing the control circuit and the short-term volatile memory. As will be described in more detail below, one or more embodiments of the present invention determine whether valid data is present in the short-term non-volatile memory, and implement a predetermined function using the short-term non-volatile memory. For example, the circuit of FIG. 1 may be used to store a count of a number of power-on cycles of the circuit 102, where rapid power-off and power-on cycles may indicate an attempt to comprise data stored in device.

The control circuit 106 of FIG. 1 determines whether valid data is stored in the short-term non-volatile memory based upon data remanence of the volatile memory elements in the short-term non-volatile memory 104. Data remanence is associated with the property that unpowered volatile memories lose their data over time, rather than all at once. Other factors, such as a magnetic field, may cause the short-term, non-volatile memory to lose their states. While the rate of data loss may be variable and dependent on the circuits implemented in a device, known data in a data valid portion of the short-term non-volatile memory may be used to determine whether other data in the short-term non-volatile memory is valid. That is, while the rate of decay of data stored in the volatile memory elements may vary, the determination of whether valid data remains in the volatile memory elements may be based upon a comparison of data read back from a portion of the volatile memory elements with known data. While specific reference is made to a power-off condition which affects the states of the short-term, non-volatile memory by way of example, the circuits and methods of the present invention may be implemented in response to other conditions which affect the states of the volatile memory elements.

When power to the circuit 102 is turned on, the circuit first re-powers the short-term non-volatile memory 104 to hold data and freeze the remanence pattern, or the pattern of the bits of the volatile memory elements as they exist after a power-up is detected. The next step in the boot-up operation is to read data from at least a portion of the volatile memory elements, and determine the amount of incorrect data. The determination of the amount of incorrect data may be used to determine whether the data in the portion of the non-volatile memory elements is valid, and therefore other data stored in the volatile memory elements is valid.

As will be described in more detail below, while the circuit is powered-on, a known bit pattern is stored in a data valid portion. Data to be used by a circuit coupled to the short-term non-volatile memory is stored in a data portion. When the chip having the memory is powered-off, both portions lose data integrity, where at least some of the bits will flip. When power is restored, the data which exists in the portions is frozen, where some of the originally stored data may be lost. However, due to data remanence, if power is restored quickly enough and there is sufficient redundancy on the data, the data in the data portion may be recoverable. In particular, the data valid portion is checked. If the data in the data valid portion has degraded too much, then it can be deduced that power was turned off too long and that the data in the data portion is not valid. Otherwise, if data in the data valid portion indicates that the originally stored data has not degraded too much based upon some predetermined criteria, it can be deduced that the data in the data portion is recoverable. The data of the data portion may then be read and error correction applied, if applicable. An implementation of an embodiment of the short-term non-volatile memory 104 will be described in more detail below in reference to FIG. 7.

Figure 2:
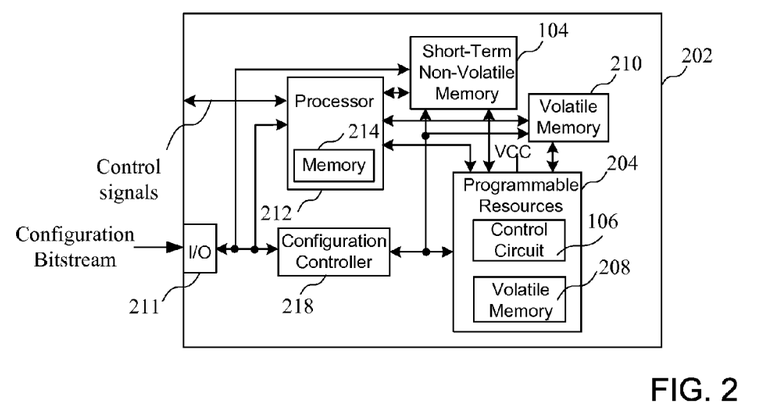
FIG. 2 is a block diagram of a device having programmable resources incorporating a circuit enabling a non-volatile memory in an integrated circuit according to an embodiment of the present invention.
Figure 4:
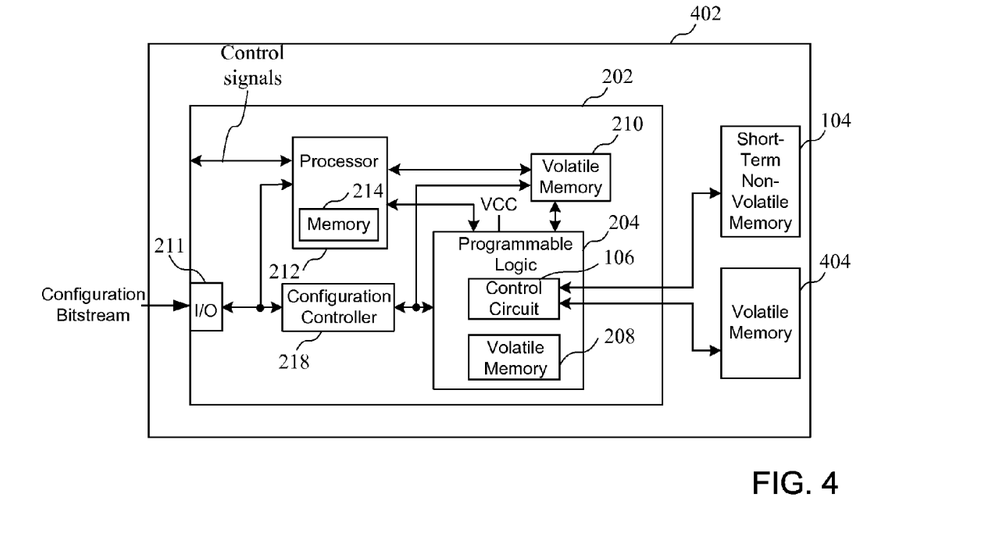
FIG. 4 is a block diagram of an electronic system comprising a device having programmable resources incorporating a circuit enabling a non-volatile memory according to an embodiment of the present invention.
Figure 5:
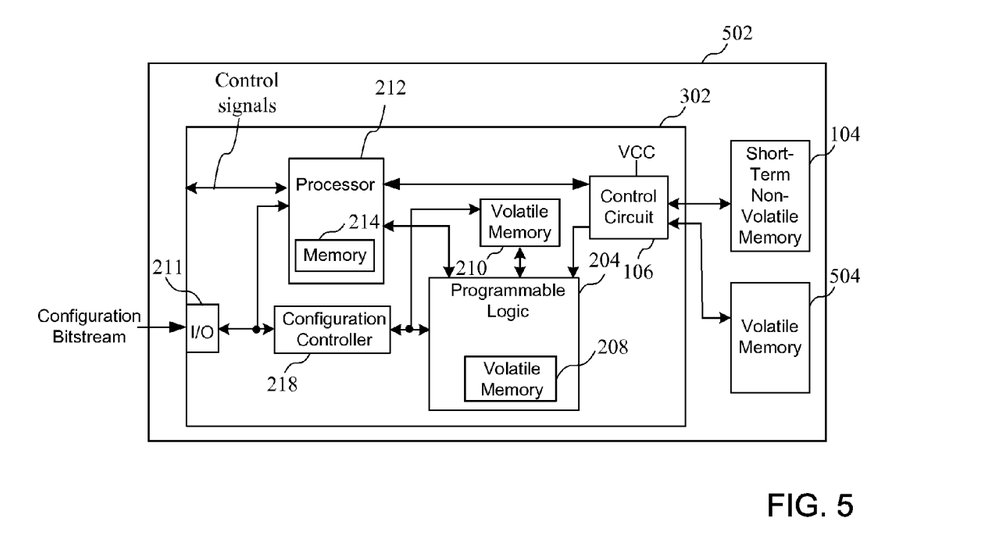
FIG. 5 is a block diagram of an electronic system comprising a device having programmable resources and a circuit enabling a non-volatile memory according to an alternate embodiment of the present invention.

Turning now to FIG. 2, a block diagram of a device having programmable resources incorporating a control circuit which enables a non-volatile memory in an integrated circuit is shown. A device 202 incorporates programmable resources 204, where the control circuit 106 is implemented in the programmable resources. Circuits for implementing programmable resources will be described in more detail in reference to FIGS. 9 and 10. According to the embodiment of FIG. 2, the programmable resources may comprise volatile memory 208, and may be coupled to other circuits such as a volatile memory 210. The short-term non-volatile memory 104 may be coupled to an I/O port 211 of the device. A processor 212 having a memory 214 is also coupled to the I/O port 211 and the short-term non-volatile memory 104. The memory 214 of the processor may be a volatile memory cache for storing program code or data. As will be described in more detail below, the data of the memory 214 may be used as a short-term non-volatile memory. It should be understood that, while the short-term non-volatile memory is shown separate from the programmable resources and other volatile memory, the circuits and methods may be implemented with any volatile memory or portion of a volatile memory of the device 202. As will be described in FIGS. 4 and 5, the short-term non-volatile memory may be implemented off the device 202 or 302. Further, as will be described in more detail below in reference to FIGS. 9 and 10, the volatile memory 208 may be associated with configurable logic blocks, while the volatile memory 210 may be associated with blocks of random access memory (BRAMs).

Data from a configuration bitstream may be loaded into the short-term non-volatile memory 104, the volatile memory 208, or the volatile memory 210 of the device 202 by way of a configuration controller 218. Alternatively, the configuration data may be loaded by way of the processor 212, or some other circuit, such as a Joint Test Action Group (JTAG) circuit, as is well known in the art. As described above in reference to FIG. 1, the short-term non-volatile memory 104 is loaded with data in both a data valid portion and a data portion. As will be described in more detail below, the processor 212 or the control circuit 106 may be used to determine whether data stored in the short-term non-volatile memory 104 comprises valid data after a power-on condition is detected, where the data previously had been stored in the short-term non-volatile memory 104.

Figure 3:
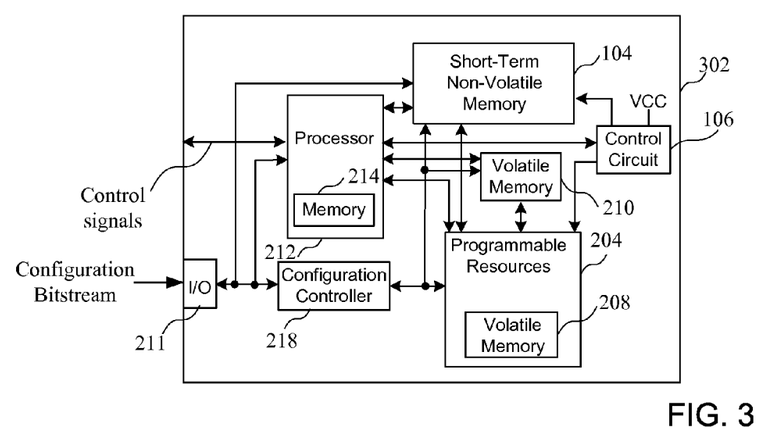
FIG. 3 is a block diagram of a device having programmable resources and a circuit enabling a non-volatile memory in an integrated circuit according to an alternate embodiment of the present invention.

As shown in the embodiment of FIG. 3, a device 302 having programmable resources comprises the control circuit 106 which is implemented separate from the programmable resources 204. For example, the control circuit 106 may be implemented in hard logic or fixed circuits of the device 302. The circuits and methods of the present invention may also be implemented using memory devices, including the short-term non-volatile memory, external to the device 302 having programmable resources. For example, in the embodiment of FIG. 4, a system 402 implements the device 202, which is coupled to short-term non-volatile memory 104 and volatile memory 404 external to the device 202. According to the embodiment of FIG. 5, a system 502 implements the device 302 which is coupled to short-term non-volatile memory 104 and volatile memory 504 external to the device 302.

Figure 6:
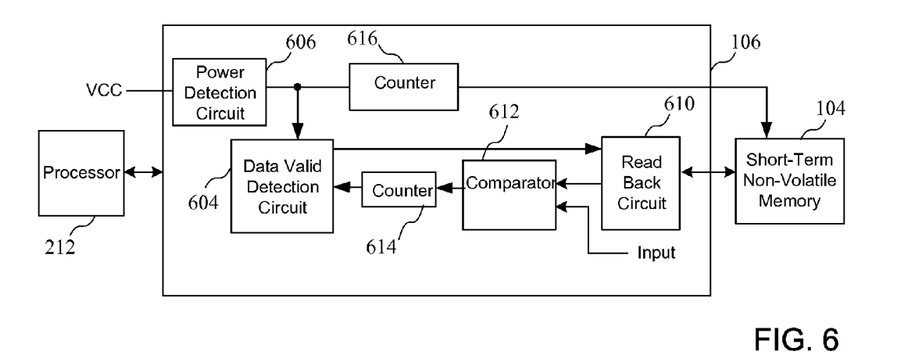
FIG. 6 is a block diagram of a control circuit according to an embodiment of the present invention.

FIG. 6 shows a block diagram of a control circuit according to an embodiment of the present invention. According to the embodiment of FIG. 6, the control circuit 106 includes a data valid detection circuit 604. A power detection circuit 606 detects when a power signal, designated in FIG. 6 as VCC, is applied to the device. A readback circuit 610 enables reading data from the short term non-volatile memory 104 so that it can be determined whether data stored in the short-term non-volatile memory is valid. A comparator 612 coupled to the readback circuit may include an "exclusive or" (XOR) circuit, for example, which generates an error signal when incorrect data values are read from the memory. That is, the comparator 612 will compare data read from a data valid portion to known valid data to determine whether the data in the data valid portion is valid data. If the data originally stored in the short-term non-volatile memory is a block of all logical "1s" or "0s", the comparison is based upon a fixed input having a logical "1" or "0" to the comparator. As will be described in more detail below, the data stored in the short-term non-volatile memory have some other bit pattern, in which case the data from the short-term non-volatile memory is compared to known valid data of the bit pattern stored in a non-volatile memory accessible by the control circuit 106. A counter 614 may keep a count of the errors to determine whether data stored in the data valid portion of the short-term non-volatile memory is valid. A second counter 616 may be employed to maintain a count of power-on conditions as detected by the power detection circuit 606. As will be described in more detail below, a count of power-on conditions stored in the short-term non-volatile memory may be used to detect improper attempts to access data in the integrated circuit.

In operation, after the detection of power being applied to the circuit during a power-on condition, the data valid detection circuit will instruct the read back circuit 610 to read at least portions of the data present in the short-term non-volatile memory 104. In particular, data read back from a data valid portion of the short-term non-volatile memory 104 is applied to the comparator 612. Based upon the comparison, the data valid detection circuit determines whether the data in the data valid portion is valid, and therefore whether the data in the data portion would also be considered to be valid. For example, the counter 614 coupled to the comparator 612 enables tabulating the number of errors detected in reading back data from the short-term non-volatile memory. Depending upon how many errors are detected, the data valid detection circuit 604 will determine whether the data in the data valid portion is valid. As will be described in more detail below, different criteria may be used to determine whether data in the data valid portion is valid.

The counter 616 is also coupled to the power detection circuit 606 to tabulate the number of times that the power detection circuit 606 has detected a power-on condition. For example, if the data valid detection circuit detects a predetermined number of power-on conditions (based upon the count in the counter 616) within a predetermined period of time, the attempts to continuously power-on the device may be determined to be an attempt to illegally access data, such as a configuration bitstream of the device. The various elements of FIG. 6 may be implemented in programmable resources of the device, or in separate hard wired circuits. Alternatively, all or portions of the circuit of FIG. 6 may be implemented in software running on a processor as set forth above in reference to FIGS. 2-5.

Figure 7:
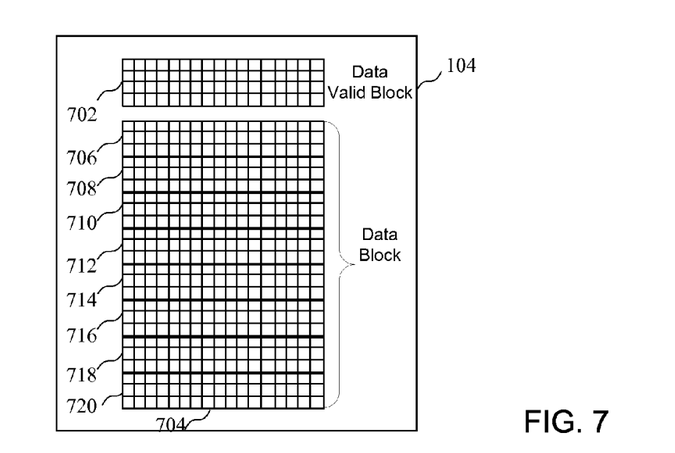
FIG. 7 is a block diagram of short-term non-volatile memory according to an embodiment of the present invention.

Turning now to FIG. 7, a block diagram of the short-term non-volatile memory 104 is shown. In particular, a data valid portion 702 comprises one or more blocks of data, while the data portion 704 comprises at least one block of data. By way of example in FIG. 7, the data valid block comprises one block of data, and the data portion may comprises eight blocks 706-720 for storing data associated with eight bits of a data word. That is, each block is represented by a number of redundant bits. If the data in the data valid block is determined to be valid, a value associated with each block is determined to represent a bit of the data word. For example, if the majority of the bits of data block 706 are determined to be logical "1s", that bit of the data word will be determined to be a logical "1". The values for the remaining bits of the data word will also be determined based upon the values of the redundant bits in each of the blocks 708-720. The sizes of the data valid block may vary from the data blocks. That is, the data valid block may be implemented with a greater number of bits to increase the reliability of determining whether the data in the data valid block is valid. Fewer bits are then required to determine the value for data in a given data block. The sizes of the blocks and the representation are exemplary, the number of data blocks and the number of bits chosen to represent them can be any number. Further, the criteria for determining the validity of data in a data valid block and a data block may be different. While a data valid block and data blocks are shown, the circuits and methods of the present invention may be employed with a single block. As will be described in more detail below, both the validity of the data and the value of the data may be determined from the single data block. Alternatively, the circuits and methods of the present invention may be employed just with a plurality of data blocks, where the validity of the data is determined based upon one or more data blocks, and the values of the data blocks is determined from the data blocks if determined to be valid.

In operation, appropriate values will be stored in the short-term non-volatile memory 104, and then the circuit will determine whether the data is valid after a power-on condition is detected. That is, while the chip is powered-on, a data pattern is stored in the data valid portion, while data to be used by the circuit is stored in the data portion. When the chip is powered-off, both portions lose data integrity as some of the bits will unintentionally flip. When power is then restored, the data in both portions may have errors and will likely not have the data as it was originally stored. However, the data stored in the data portion may be recoverable. If it is determined that the data in the data valid portion has not degraded too much, the data in the data portion may be read back to determine the value of the bits of the data word, where each bit is represented by a data block 706-720 having redundant data bits. As will be described in more detail below, error correction may be applied, if applicable.

While the short-term non-volatile memory 104 is divided conceptually into at least two portions, the memory need not be physically divided, nor do the blocks or bits associated with the data valid block or a given data block necessarily need to be together. The first portion serves as a data valid indicator and is initialized with a value that will be unchanged regardless of the data being stored in the data portion during a power-off condition. Data in the data portion may be stored with traditional error correction or may be stored using brute-force redundancy methods. In some embodiments, no redundancy is used for the data portion.

According to one embodiment, the data valid portion 702 may consist of two 1 kilobit (Kb) blocks of memory, where all of the bits of one block are set to "0", and all of the bits of the other are set to "1". The data portion 704 may consists of 1 Kb blocks of memory, where each bit of data to be stored in the data portion may include one 1 Kb block of memory. All 1024 bits in the 1 Kb memory block are set to a logical "1" to store a "1" bit of the data word, while all 1024 bits are set to "0" to store a logical "0" bit of the data word.

On power-up, the two blocks of the data valid portion are read and the fraction of correct bits is computed. According to one embodiment, if the fraction of "1" bits in the block having all logical "1s" is more than fifty percentage points higher than the fraction of "1" bits in the block having all logical "0s", then it can be concluded that the data in the data valid portion is valid, and therefore the data represented by data blocks 706-720 should also be valid. For example, when the block having all logical "1s" has eighty percent ones and the block having all logical "0s" has thirty percent ones, the data will be determined to be valid. The data is then read. If the percentage of bits is closer to the block having all logical "1s" in the data valid portion after measuring the percentage of logical "1" bits in each of the data blocks, then it can be determined that the data is a logical "1." If the percentage of bits is closer to the block having all logical "0s", it can be determined that the data is a logical "0."

Alternatively, a single block may be used in the data valid portion, where all of the data is set to either a logical "0" or a logical "1". The data may be determined to be valid if a predetermined percentage of the bits have retained their original value. The predetermined percentage for the block having all logical "0s" may be different than the predetermined percentage for the block having all logical "1s" due to the differences in the likelihood that a bit will flip for a logical "0" bit and a logical "1" bit. Accordingly, a determination of valid data in the data valid portion may be evaluated based upon different criteria for a block having all "0" bits and a block having all "1" bits. Because of the greater probability of a logical "1" changing to a logical "0", a block of all logical "1"s is preferably used.

Rather than using blocks of a common logical bit, such as a block of "1s" or a block of "0s", the data in the data valid portion could be any block of known data. The data read back from the data valid portion would then be compared to known valid data. For example, the known valid data could be a data pattern stored in a non-volatile memory accessible by the control circuit for determining whether the data is valid. The data pattern comprising the known valid data may be data used by the circuit for other purposes. For example, program code in the memory of the processor may be used. The control circuit may be implemented to determine valid data in the data valid portion by a comparison to known valid data as described in U.S. patent application Ser. No. 12/402,362 of the inventor of the current application, entitled "CIRCUITS FOR AND METHOD OF DETERMINING A PERIOD OF TIME DURING WHICH A DEVICE IS WITHOUT POWER" and filed by the Assignee of the present application on Mar. 11, 2009, the entire application of which is incorporated herein by reference.

According to one embodiment, the determination of valid data in the data valid portion may depend upon the type of data being stored in the data portion. For example, if a bitmap image is stored, the threshold for determining that valid data is stored in the data valid portion is lower than if critical data is stored. Because some errors in the data of the bitmap image may affect the resolution of the image, it may be acceptable to recover the bitmap image after a power-on is detected even if some of the data is lost. However, if there is a need for a high likelihood that the data is valid, the threshold for determining that valid data is stored in the data valid portion would be higher.

The size of the data blocks described in reference to FIG. 7 is provided by way of example, and the data blocks may be implemented in different sizes depending upon accuracy requirements, circuit limitations or other factors. For example, the data valid portion may be much larger, such as 1 megabyte (Mb), to give a more accurate indication of the validity of the data, or it may be much smaller, such as 3 bits, to save area. A larger number of bits enables a longer time during which the data may be recovered. The data valid portion may be volatile memory associated with any element of the circuit, including configuration memory or program store for a microprocessor.

Rather than using a data valid portion, a fixed check of the data blocks may be used. That is, the stored data would be evaluated to determine whether it is valid. For example, if more than 60% of the bits in a block are a logical "1," then the data bit of the data word is assumed to be a logical "1." Otherwise, the data bit is assumed to be a logical "0." According to an alternate embodiment, if more than 80% of the bits in a data block are logical "1s", the data bit is assumed to be a logical "1", whereas if fewer than 20% of the bits are a logical "1", then the data is assumed to be a logical "0." If the number of logical "1s" is between 20% and 80%, the data bit is assumed to be invalid. A single invalid data bit need not invalidate all data bits. In some embodiments, the data bits themselves may have an additional level of redundancy. For example, there may be nine bits representing eight data bits and one parity bit. If parity does not match, the data is determined to be not valid. However, it should be understood that other types of redundancy schemes may be used according to the present invention. For example, a redundancy methods implementing Hamming codes may be used.

Figure 8:
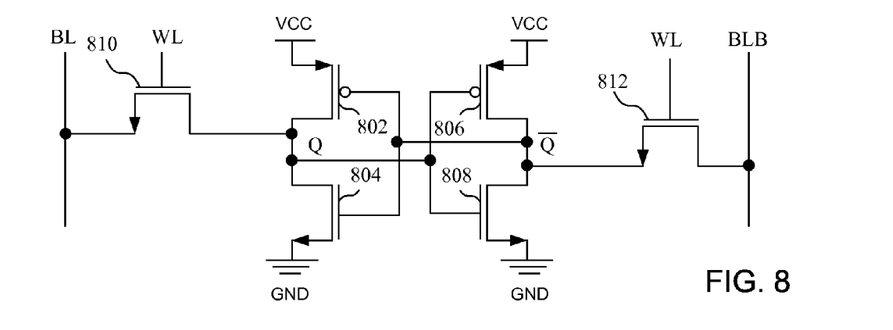
FIG. 8 is a circuit diagram of a memory element of a volatile memory that may be implemented in FIGS. 1-7 according to an embodiment of the present invention.

FIG. 8 shows a circuit diagram of a memory element of a volatile memory that may be implemented according to another embodiment of the present invention. In particular, the memory cell of FIG. 8 may be implemented in the short-term non-volatile memory 104. A memory cell of a volatile memory according to the embodiment of FIG. 8 includes an inverter having a p-channel transistor 802 with a source coupled to a reference voltage, such as VCC, and a drain coupled at a first node "Q" to a drain of an n-channel transistor 804, the source of which is coupled to ground GND. The memory cell also includes a second inverter having a p-channel transistor 806 with a source coupled to the reference voltage and a drain coupled at a second node "Q-bar" to a drain of an n-channel transistor 808, the source of which is also coupled to ground. The first node "Q" is controlled by an n-channel transistor 810 coupled to receive a word line (WL) signal at its gate and to receive input data on a bit line (BL) at the first node, while the second node "Q-bar" is controlled by another n-channel transistor 812 coupled to receive the word line signal WL at its gate to receive inverted input data BLB. While the volatile memory of FIG. 8 is shown by way of example, it will be clear to those of skill in the art that other volatile memory cells can be employed. For example, memory elements whose operation is affected by a magnetic field may be employed.

Figure 9:
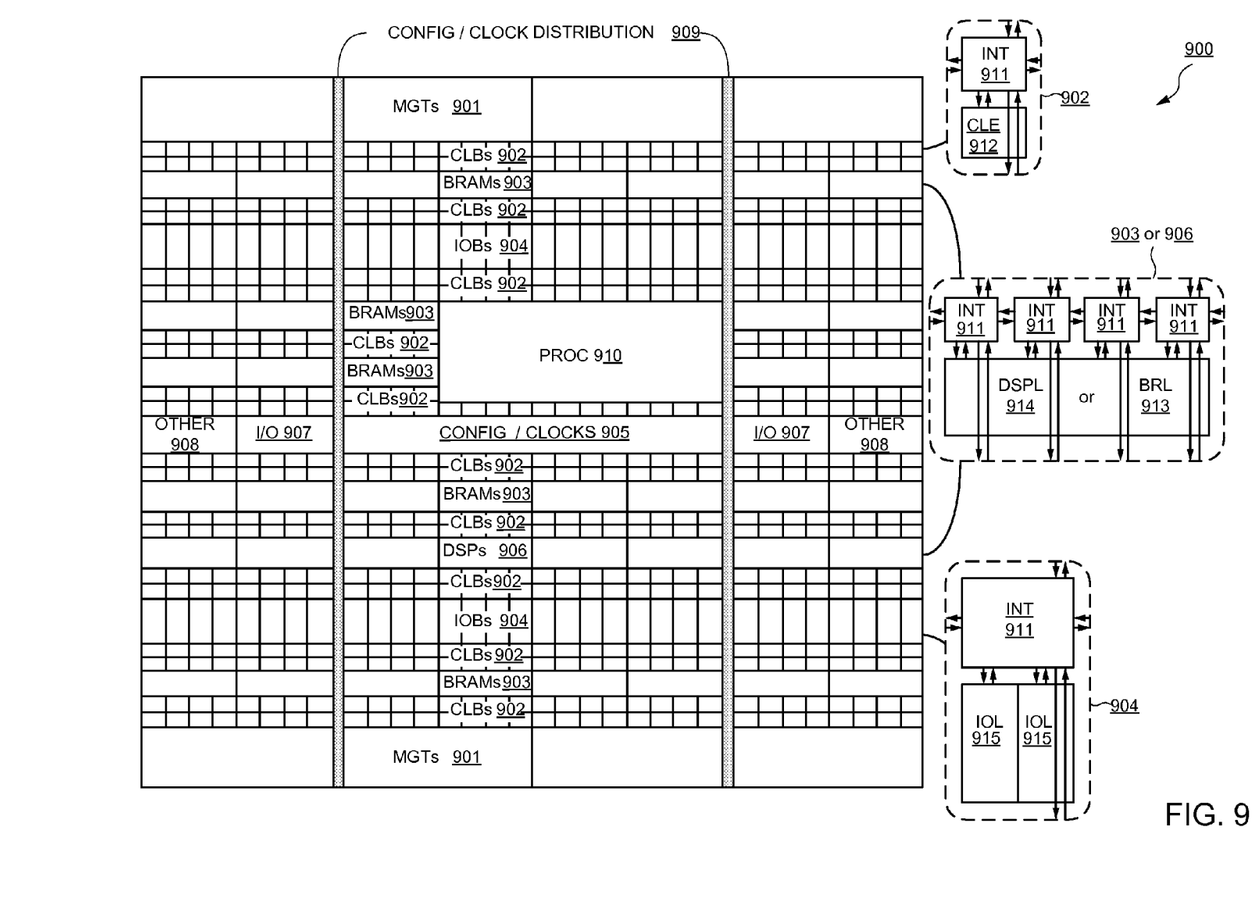
FIG. 9 is a block diagram of a device having programmable resources according to an embodiment of the present invention.

Turning now to FIG. 9, a block diagram of a device having programmable resources according to an embodiment of the present invention is shown. While devices having programmable resources may be implemented in any type of integrated circuit device, such as an application specific integrated circuit (ASIC) having programmable resources, other devices comprise dedicated programmable logic devices (PLDs). A PLD is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

FIG. 9 illustrates an FPGA architecture 900 having a large number of different programmable tiles including multi-gigabit transceivers (MGTs 901), configurable logic blocks (CLBs 902), random access memory blocks (BRAMs 903), input/output blocks (IOBs 904), configuration and clocking logic (CONFIG/CLOCKS 905), digital signal processing blocks (DSPs 906), specialized input/output blocks (I/O 907) (e.g., configuration ports and clock ports), and other programmable logic 908 such as digital clock managers, analog-to-digital converters, system monitoring logic, and so forth. Some FPGAs also include dedicated processor blocks (PROC 910).

In some FPGAs, each programmable tile includes a programmable interconnect element (INT 911) having standardized connections to and from a corresponding interconnect element in each adjacent tile. Therefore, the programmable interconnect elements taken together implement the programmable interconnect structure for the illustrated FPGA. The programmable interconnect element (INT 911) also includes the connections to and from the programmable logic element within the same tile, as shown by the examples included at the top of FIG. 9.

For example, a CLB 902 may include a configurable logic element (CLE 912) that may be programmed to implement user logic plus a single programmable interconnect element (INT 911). A BRAM 903 may include a BRAM logic element (BRL 913) in addition to one or more programmable interconnect elements. The BRAM comprises dedicated memory separate from the distributed RAM of a configurable logic block. Typically, the number of interconnect elements included in a tile depends on the height of the tile. In the pictured embodiment, a BRAM tile has the same height as four CLBs, but other numbers (e.g., five) may also be used. A DSP tile 906 may include a DSP logic element (DSPL 914) in addition to an appropriate number of programmable interconnect elements. An IOB 904 may include, for example, two instances of an input/output logic element (IOL 915) in addition to one instance of the programmable interconnect element (INT 911). The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a horizontal area near the center of the die is used for configuration, clock, and other control logic. Columnar areas 909 extending from this horizontal area are used to distribute the clocks and configuration signals across the breadth of the FPGA. Some FPGAs utilizing the architecture illustrated in FIG. 9 include additional logic blocks that disrupt the regular columnar structure making up a large part of the FPGA. The additional logic blocks may be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear, to facilitate the efficient implementation of user logic.

Figure 10:
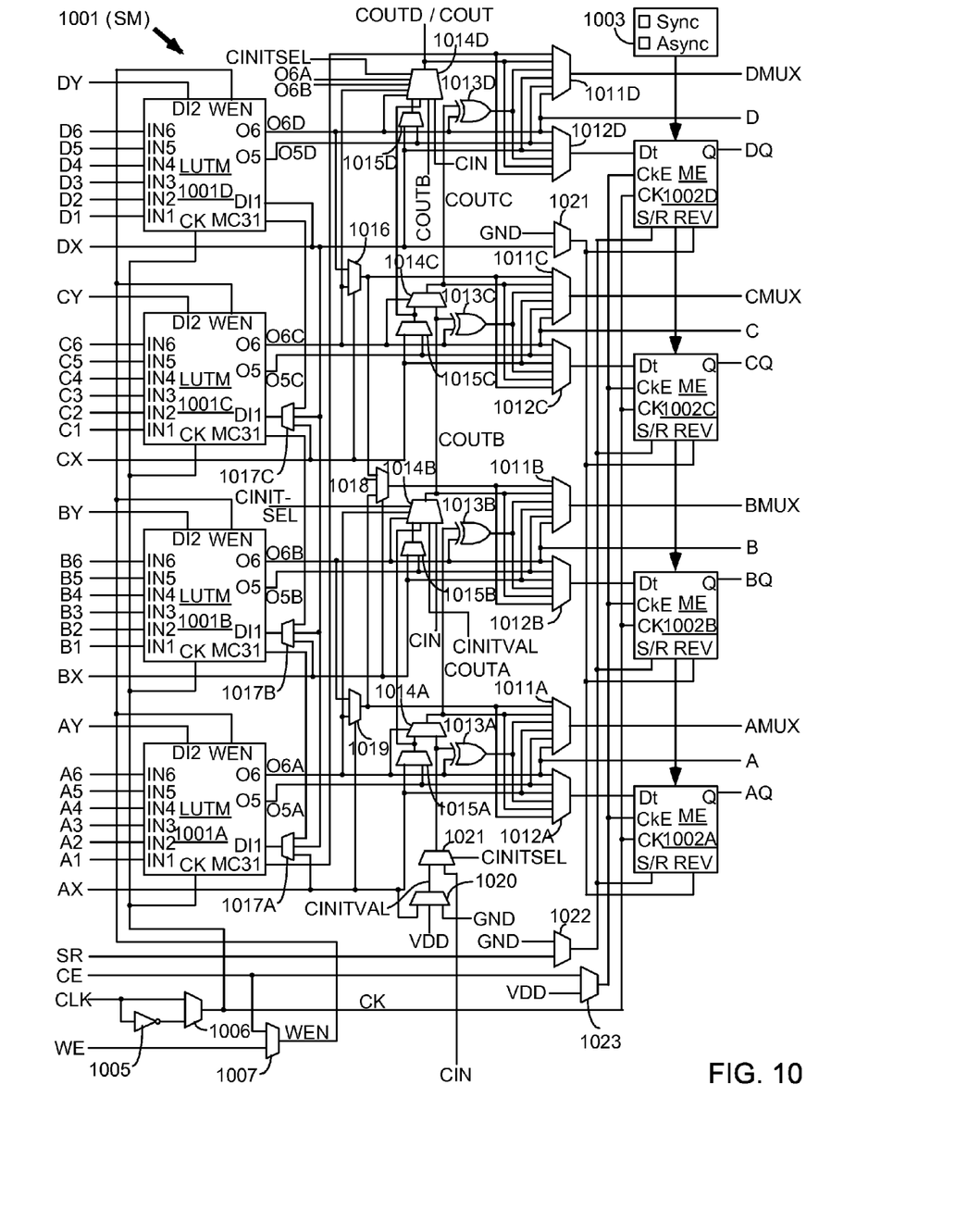
FIG. 10 is a block diagram of a configurable logic element of the device of FIG. 9 according to an embodiment of the present invention.

Turning now to FIG. 10, a block diagram of a configurable logic element of the device of FIG. 9 according to an embodiment of the present invention is shown. In particular, FIG. 10 illustrates in simplified form a configurable logic element 912 of a configurable logic block 902 of FIG. 9. In the embodiment of FIG. 10, slice M 1001 includes four lookup tables (LUTMs) 1001A-1001D, each driven by six LUT data input terminals A1-A6, B1-B6, C1-C6, and D1-D6 and each providing two LUT output signals O5 and O6. The O6 output terminals from LUTs 1001A-1001D drive slice output terminals A-D, respectively. The LUT data input signals are supplied by the FPGA interconnect structure via input multiplexers, which may be implemented by programmable interconnect element 1011, and the LUT output signals are also supplied to the interconnect structure. Slice M also includes: output select multiplexers 1011A-1011D driving output terminals AMUX-DMUX; multiplexers 1012A-1012D driving the data input terminals of memory elements 1002A-1002D; combinational multiplexers 1016, 1018, and 1019; bounce multiplexer circuits 1022-1023; a circuit represented by inverter 1005 and multiplexer 1006 (which together provide an optional inversion on the input clock path); and carry logic comprising multiplexers 1014A-1014D, 1015A-1015D, 1020-1021 and exclusive OR gates 1013A-1013D. All of these elements are coupled together as shown in FIG. 10. Where select inputs are not shown for the multiplexers illustrated in FIG. 10, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured embodiment, each memory element 1002A-1002D may be programmed to function as a synchronous or asynchronous flip-flop or latch. The selection between synchronous and asynchronous functionality is made for all four memory elements in a slice by programming Sync/Asynch selection circuit 1003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1002A-1002D are clocked by a clock signal CK, which may be provided by a global clock network or by the interconnect structure, for example. Such programmable memory elements are well known in the art of FPGA design. Each memory element 1002A-1002D provides a registered output signal AQ-DQ to the interconnect structure. Because each LUT 1001A-1001D provides two output signals, O5 and O6, the LUT may be configured to function as two 5-input LUTs with five shared input signals (IN1-IN5), or as one 6-input LUT having input signals IN1-IN6.

In the embodiment of FIG. 10, each LUTM 1001A-1001D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1017A-1017C for LUTs 1001A-1001C), or to the two 32-bit RAMs via input terminals DI1 and DI2. RAM write operations in the LUT RAMs are controlled by clock signal CK from multiplexer 1006 and by write enable signal WEN from multiplexer 1007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1001A may also be provided to the general interconnect structure for shift register chaining, via output select multiplexer 1011D and CLE output terminal DMUX.

The circuits of FIGS. 1-8 may be implemented in the device of FIGS. 9 and 10, or in any suitable device, including any type of integrated circuit having programmable resources. For example, the short-term non-votatile memory 104 may be implemented using configurable memory elements storing configuration data bits associated with configuration resources, including the BRAMs or LUT RAM of the CLEs as set forth above.

Figure 11:
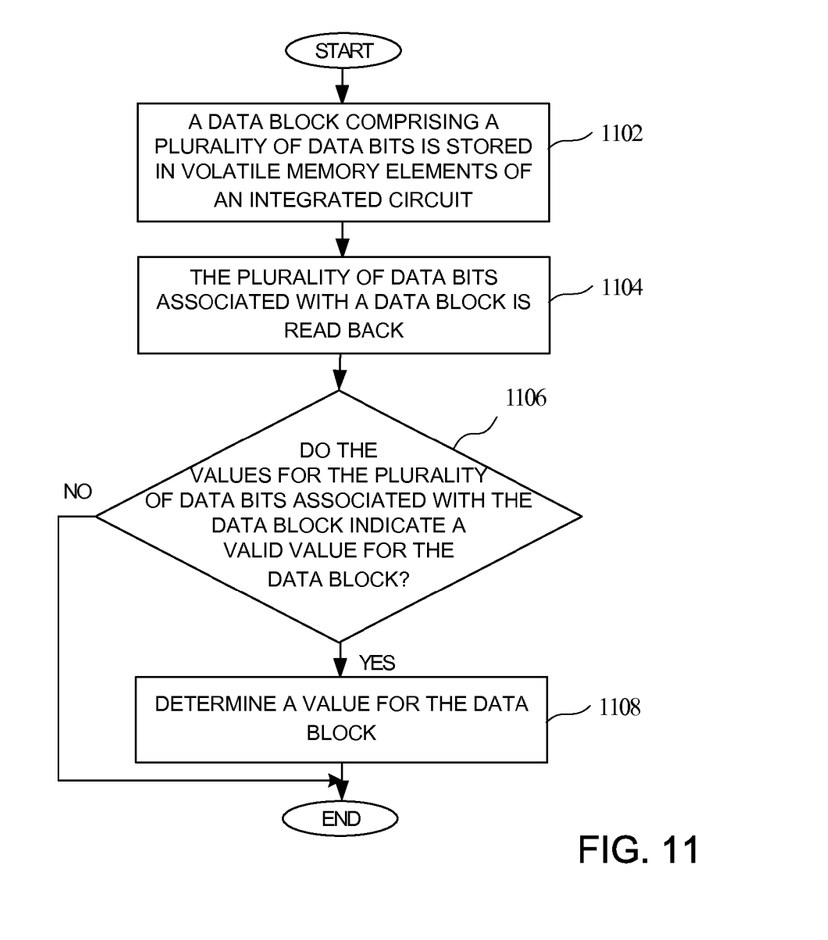
FIG. 11 is a flow chart showing a method of providing a non-volatile memory in an integrated circuit according to an embodiment of the present invention.

The following flow charts show methods that may be implemented according to some aspects of the present invention. The methods of FIGS. 11-13 may be implemented using any of the circuits of FIGS. 1-10 as described above, or using other suitable circuits or systems. Turning first to FIG. 11, a flow chart shows a method of providing a non-volatile memory in an integrated circuit according to an embodiment of the present invention. A data block comprising a plurality of data bits is stored in volatile memory elements of an integrated circuit at a step 1102. The plurality of data bits associated with a data block is read back at a step 1104. For example, the data is read back after it is determined that an environment (e.g. a change in the power or magnetic field applied to the memory) causing the memory elements to loose their states have passed. It is then determined whether the values for the plurality of data bits associated with the data block indicate a valid value for the data block at a step 1106. If so, a value for the data block is determined at a step 1108.

Figure 12:
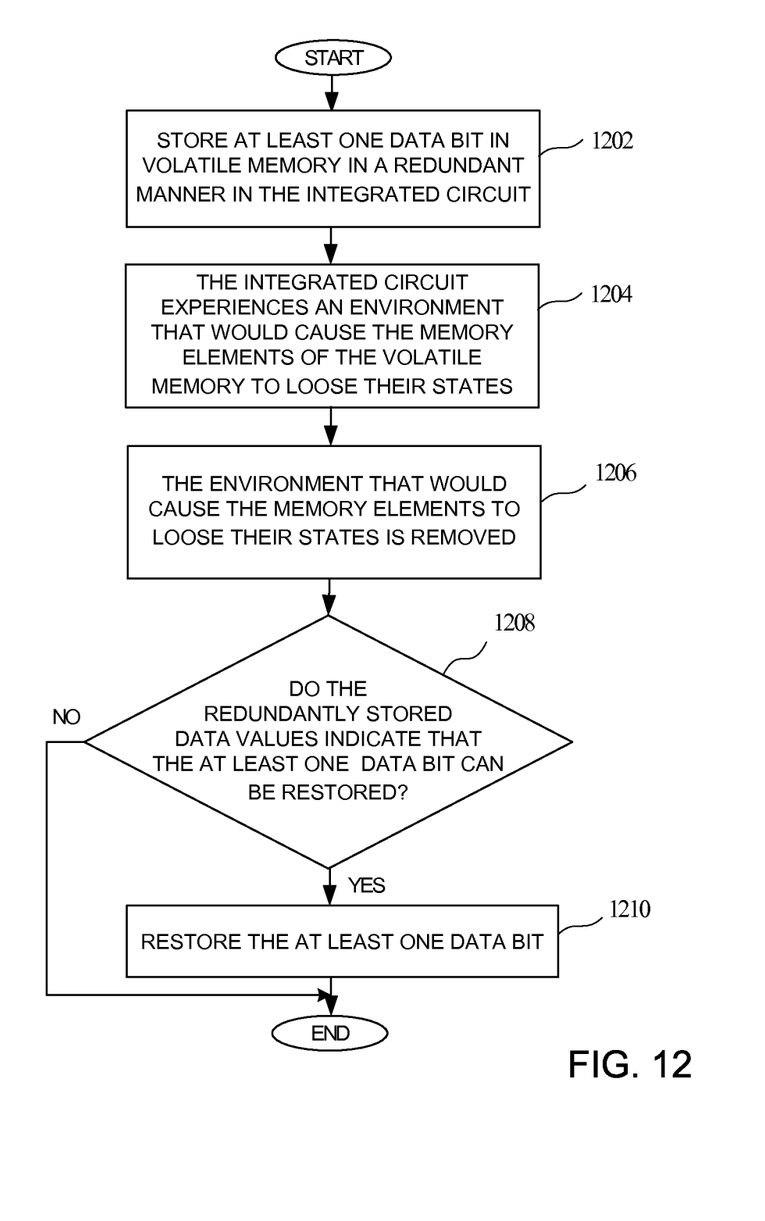
FIG. 12 is a flow chart showing a method of providing a non-volatile memory in an integrated circuit according to an alternate embodiment of the present invention.

FIG. 12 is a flow chart showing a method of providing a non-volatile memory in an integrated circuit according to an alternate embodiment of the present invention. At least one data bit is stored in volatile memory in a redundant manner in the integrated circuit at a step 1402. For example, the data bit may be represented by a block of memory cells storing all logical "1s" or all logical "0s". The integrated circuit experiences an environment that would cause the memory elements of the volatile memory to loose their states at a step 1404. For example, the power may be removed from the device, or the device may be exposed to an electric field which may cause data stored in the volatile memory to be lost. The environment that would cause the memory elements to loose their states is removed at a step 1406. It is then determined whether the data values of the redundant information indicate that the at least one data bit can be restored at a step 1408. If so, the at least one data bit is restored at a step 1410

Figure 13:
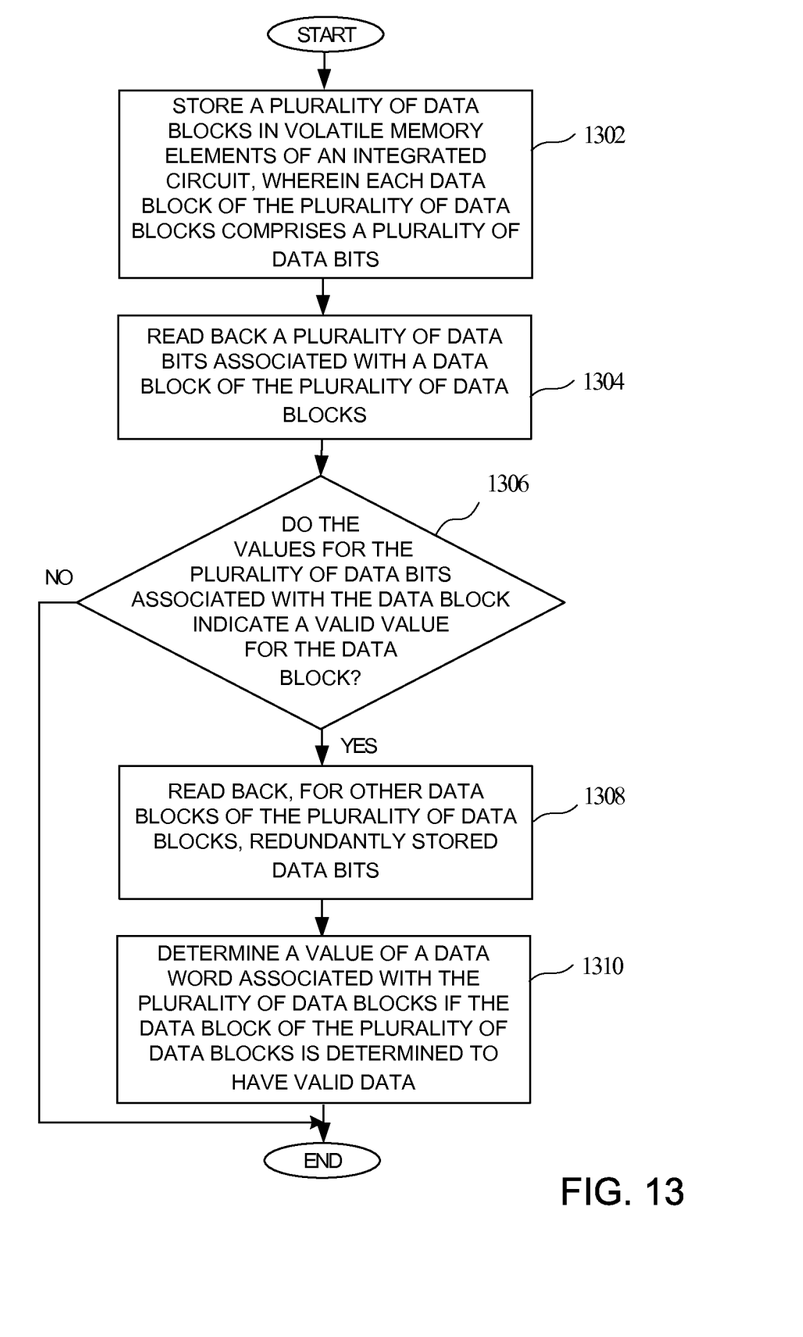
FIG. 13 is a flow chart showing a method of providing a non-volatile memory using a plurality of data blocks in an integrated circuit according to an embodiment of the present invention.

Turning now to FIG. 13, a flow chart shows a method of providing a non-volatile memory using a plurality of data blocks in an integrated circuit according to an embodiment of the present invention. In particular, a plurality of data blocks are stored in volatile memory elements of an integrated circuit at a step 1302, wherein each data block of the plurality of data blocks comprises a plurality of data bits. A plurality of data bits associated with a data block of the plurality of data blocks is read back at a step 1304. It is then determined whether the values for the plurality of data bits associated with the data block indicate a valid value for the data block at a step 1306. If so, for other data blocks of the plurality of data blocks, redundantly stored data bits are read back to determine a value for the other data blocks at a step 1308. A value of a data word associated with the other data blocks is determined at a step 1310 if the data block of the plurality of data blocks has valid data. A value of the data word may include a bit associated with the data block of the plurality of data blocks which is used to determine whether the data is valid.

Figure 14:
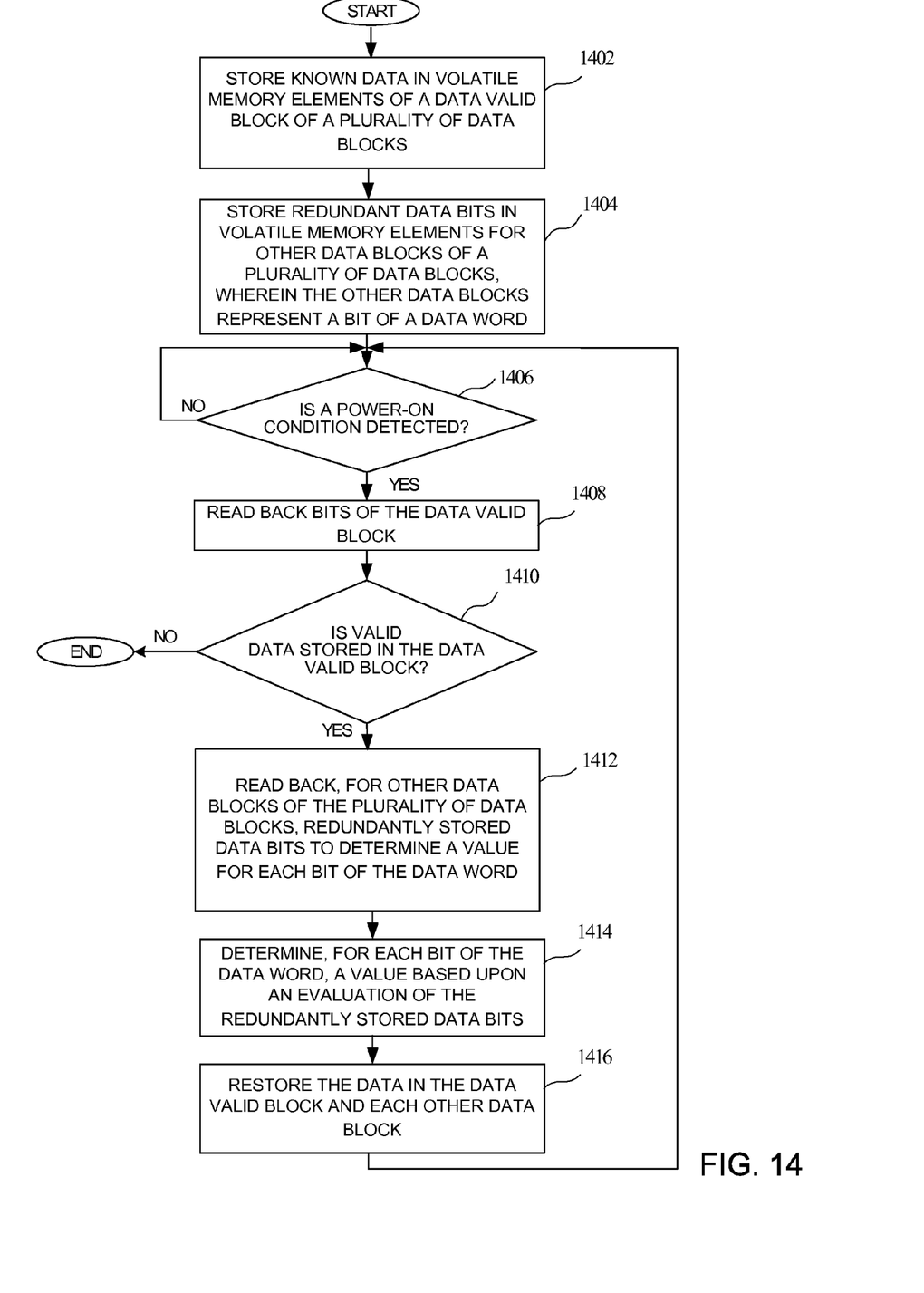
FIG. 14 is a flow chart showing a method of providing a non-volatile memory using a plurality of data blocks in an integrated circuit according to an alternate embodiment of the present invention.

Turning now to FIG. 14, a flow chart shows a method of providing a non-volatile memory using a plurality of data blocks in an integrated circuit according to an alternate embodiment of the present invention. Known data is stored in volatile memory elements of a data valid block of a plurality of blocks at a step 1402. Redundant data bits are stored in volatile memory elements for other blocks of a plurality of blocks, wherein the other blocks represents a bit of a data word at a step 1404. It is then determined whether a power-on condition is detected at a step 1406. If so, bits of the data valid block are read back at a step 1408. It is then determined whether valid data is stored in the valid data block at a step 1410. If the data in the data valid block is not valid, the process is ended. Otherwise, for the other blocks of the plurality of blocks, redundantly stored data bits are read back to determine a value for each bit of the data word at a step 1412. A value, for each bit of the data word, is determined based upon an evaluation of the values of the redundantly stored data bits at a step 1414. The data in the data valid block and each remaining block is then restored at a step 14416.

While a short-term non-volatile memory may have many applications in a circuit, one particular application for the short-term non-volatile memory may relate to securing data in an integrated circuit. In particular, security-conscious systems may come under attack during an attempt to compromise the data. For example, an attacker may alter the ciphertext of the bitstream, then attempt to configure the integrated circuit. If the attempt fails, the integrated circuit can detect the failure. After a predetermined number of failures, the integrated circuit may decide that the integrated circuit is being attacked, and then take counter-measures such as erasing sensitive data including an encryption key, for example. However, an attacker may attempt to erase the chip's memory of the attack by turning the power off. That is, an attacker may bypass the counter-measures by re-booting the FPGA after a predetermined number of tries, for example, resetting a failure-counter. Accordingly, it is possible to use the data bits of the short-term non-volatile memory to count the number of power-on cycles since the last successful configuration. When the integrated circuit configures successfully, all the data bits of the counter are then cleared to zero. While an attacker can still defeat this protection by waiting long enough between power-on cycles, the attacker slows down the rate of attack sufficiently that a brute-force attack cannot be completed in a reasonable amount of time. Accordingly, it may be beneficial to set the minimum time between memory-clearing power cycles to be at least the maximum time that the data will be valid. That is, the data in the short-term non-volatile memory will be retained as long as possible so that the clearing of the counter will only take place when the data would likely be invalid. Maintaining the counter for as long as possible would extend the time delay between attacks, making a brute-force attempt to access the data more difficult.

Figure 15:
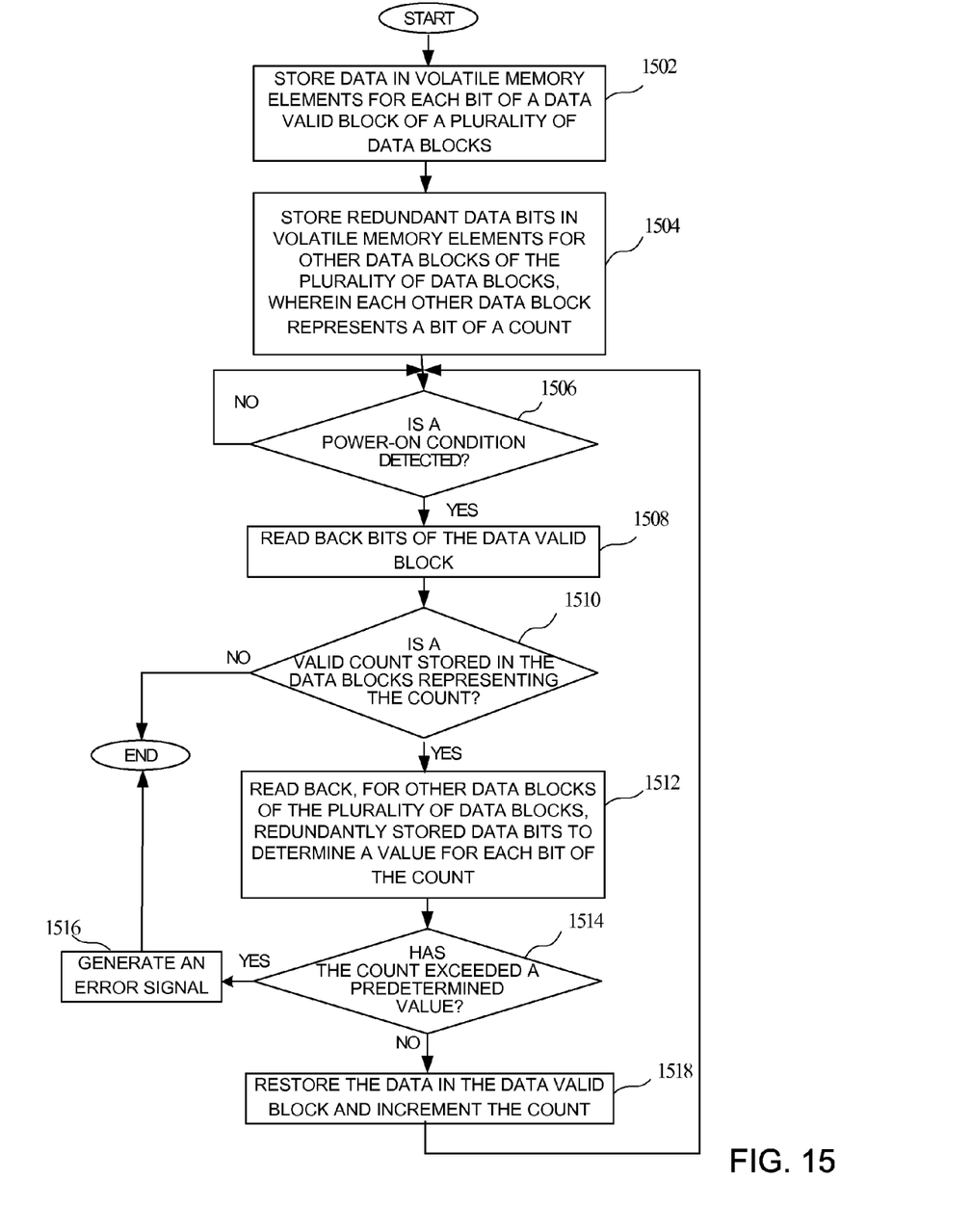
FIG. 15 is a flow chart showing a method of providing a non-volatile memory in an integrated circuit to implement a counter according to an embodiment of the invention.

As set forth in FIG. 15, a flow chart shows a method of providing a non-volatile memory in an integrated circuit to implement a counter. Data is stored in volatile memory elements for each bit of a data valid block of a plurality of blocks at a step 1502. Redundant data bits are stored in volatile memory elements for other blocks of the plurality of blocks at a step 1504, wherein each other block represents a bit of a count. It is then determined whether a power-on condition is detected at a step 1506. If so, bits of the data valid block are read back at a step 1508. It is then determined whether the count stored in the other blocks is valid at a step 1510. That is, based upon the data read back from the data valid block, it is determined whether the count is valid. If so, for the other blocks of the plurality of blocks, redundantly stored data bits are read back to determine a value for each bit of the count at a step 1512. It is then determined whether the count has exceeded a predetermined value at a step 1514. If so, an error signal is generated at a step 1516. If not, the data in the data valid block is restored and the count is incremented at a step 1516. The counter then waits for a power-on condition to be detected. The method of FIG. 15 may be used to implement a counter which determines a number of power-on conditions indicating that the integrated circuit is being attacked.

It can therefore be appreciated that the new and novel circuit for and method of providing non-volatile memory in an integrated circuit has been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A method of providing non-volatile memory in an integrated circuit, the method comprising:
    storing a plurality of data blocks in volatile memory elements of the integrated circuit, wherein each data block of the plurality of data blocks comprises a plurality of data bits;
    detecting a power-on condition;
    reading back the plurality of data bits associated with a data valid block of the plurality of data blocks in response to the detecting of the power-on condition;
    determining, by a control circuit based upon a degradation of the plurality of data bits associated with the data valid block, whether values read back for the plurality of data bits associated with the data valid block indicate valid data in the data valid block; and
    reading back, for another data block of the plurality of data blocks, stored data bits to determine a value for the other data block if it is determined that the values read back for the plurality of data bits associated with the data valid block indicate that valid data is in the data valid block.

2. The method of claim 1 wherein determining, by a control circuit, whether values read back for the plurality of data bits associated with the data valid block indicate valid data in the data valid block comprises determining, by a control circuit, whether a predetermined percentage of the plurality of data bits associated with the data valid block matches known valid data.

3. The method of claim 1 wherein storing a plurality of data blocks comprises storing data in the data valid block as a data valid bit and storing data in the other data block of the plurality of data blocks to represent a data bit.

4. The method of claim 3 wherein storing data in the data valid block comprises storing a common logical value for each bit associated with the data valid block.

5. The method of claim 4 wherein storing data in the other block of the plurality of data blocks comprises storing, for each block of the plurality of data blocks, a common logical value.

6. The method of claim 3 further comprising determining a value of a data word based upon a value for each data block of the plurality of data blocks.

7. A method of providing non-volatile memory in an integrated circuit, the method comprising:
    storing data in volatile memory elements for each bit of a data valid block;
    determining whether a power-off condition that would cause the volatile memory elements to lose their states has been encountered;
    reading back the bits of the data valid block stored in the volatile memory elements in response to a detection of a power-on condition; and
    determining, by a control circuit, based upon a degradation of the bits of the data valid block which have been read back, whether valid data is stored in the data valid block.

8. The method of claim 7 further comprising storing data in a second data block.

9. The method of claim 8 further comprising reading back bits of the second data block, wherein reading back bits of the second data block comprises reading back a bit of a data word.

10. The method of claim 8 further comprising reading back bits of the second data block, wherein a value associated with the first data block and a value of a second data block represent bits of a data word.

11. The method of claim 7 wherein determining whether a power-off condition that would cause the volatile memory elements to lose their states has been encountered comprises determining whether power has been restored to the integrated circuit.

12. The method of claim 7 wherein determining whether a power-off condition that would cause the volatile memory elements to lose their states has been encountered comprises determining whether a magnetic field had been applied.

13. The method of claim 7 further comprising restoring the data in the volatile memory elements for each bit of the data valid block if it is determined that valid data is stored in the data valid block.

14. A circuit for providing non-volatile memory in an integrated circuit, the circuit comprising:
    at least one memory block for storing a data bit, the at least one memory block comprising a plurality of volatile memory elements storing a common logical value; and
    a control circuit coupled to the at least one memory block, wherein the control circuit determines whether data of a data valid block stored in the at least one memory block is valid based upon a degradation of the data of the data valid block, and reads back, for the at least one memory block in response to a detection of a power-on condition, stored data bits to determine a value for a data word if the data of the data valid block stored in the at least one memory block is determined to be valid.

15. The circuit of claim 14 further comprising at least one other memory block comprising a data block.

16. The circuit of claim 14 wherein the at least one memory block comprises a plurality of memory blocks, where the control circuit reads back, for each memory block of the plurality of memory blocks, redundantly stored data bits to determine a value for each bit of the data word.

17. The circuit of claim 16 wherein the plurality of memory blocks comprises a memory associated with a counter, the control circuit being coupled to increment a stored count when the power-on condition is detected.

18. The circuit of claim 17 wherein the control circuit generates an error signal when the stored count exceeds a predetermined value.

19. The circuit of claim 17 wherein the control circuit sets a minimum time between memory-clearing power cycles.

\* \* \* \* \*